(12) United States Patent
Maksimovic et al.

(10) Patent No.: US 7,271,754 B2
(45) Date of Patent: Sep. 18, 2007

(54) DIGITAL PULSE-WIDTH MODULATOR

(75) Inventors: Dragan Maksimovic, Boulder, CO (US); Asif Syed, Boulder, CO (US); Ershad Ahmed, Richardson, TX (US)

(73) Assignee: The Regents of the University of Colorado, a body corporate, Boulder, CO (US)

( * ) Notice: Subject to any disclaimer, the term of this patent is extended or adjusted under 35 U.S.C. 154(b) by 0 days.

(21) Appl. No.: 11/360,462

(22) Filed: Feb. 22, 2006

(65) Prior Publication Data

US 2006/0227861 A1 Oct. 12, 2006

Related U.S. Application Data

(60) Provisional application No. 60/655,188, filed on Feb. 22, 2005.

(51) Int. Cl.
*H03M 1/82* (2006.01)
(52) U.S. Cl. .......................... 341/152; 341/53
(58) Field of Classification Search ............... 341/155, 341/53, 157; 323/283, 282
See application file for complete search history.

(56) References Cited

U.S. PATENT DOCUMENTS

| | | | | |
|---|---|---|---|---|
| 3,745,318 | A | * | 7/1973 | Stroman ................. 708/620 |
| 4,209,775 | A | * | 6/1980 | Kawashima et al. ......... 341/145 |
| 4,694,194 | A | * | 9/1987 | Hansel et al. .............. 307/66 |
| 2002/0149505 | A1 | * | 10/2002 | Kanno ..................... 341/152 |

OTHER PUBLICATIONS

Kelkar, S.S., et al., "A Novel Feedforward Compensation Canceling Input Filter-Regulator Interaction", IEEE TAES, Mar. 1983, AES-19(2):258-268.

Arbetter, Barry, et al., "Feed-Forward Pulse-Width Modulators for Switching Power Converters", IEEE, 1995, 601-607, no month.
Williams, Richard, et al., "High-Frequency DC/DC Converter for Lithium-Ion Battery Applications Utilizes Ultra-Fast CBiC/D Process Technology", IEEE, 1995, 322-332, no month.
Dancy, Abram P., et al., "Ultra Low Power Control Circuits for PWM Converters", IEEE, 1997, 21-27, no month.

(Continued)

*Primary Examiner*—Peguy JeanPierre
(74) *Attorney, Agent, or Firm*—Hensley Kim & Edgington, LLC

(57) ABSTRACT

A digital pulse-width modulator is provided that receives a digital command input signal and a secondary control input signal and provides a pulse-width-modulated output signal. The pulse-width-modulated output signal comprises a pulse-width that corresponds to an integer number of slots each having a time duration. The integer number of slots corresponds to a value of the digital command signal, and the time duration is determined based upon the secondary control input signal. In one embodiment, the digital pulse-width-modulator comprises a plurality of delay cells arranged in series for propagating a clock signal through the plurality of delay cells. A time delay for each of the delay cells is determined by the secondary control input signal. A controller is enabled to set the output signal to a first value at the start of a propagation of the clock through the plurality of delay cells and to set the output signal to a second value when the clock signal propagates to one of the delay cells identified by the digital command signal. In another embodiment, the digital pulse-width-modulator is used with a switched-mode power converter. A digital command signal based on a feedback signal from the converter and a secondary control signal derived from an input voltage of the converter are received by the digital pulse-width-modulator. The digital pulse-width-modulator provides a pulse-width-modulated output signal based on the digital command signal and the secondary control signal. The output signal is then provided to the converter to control at least one switch of the converter.

48 Claims, 15 Drawing Sheets

OTHER PUBLICATIONS

Lu, Zhengyu, et al., "Reduction of Digital PWM Limit Ring with Novel Control Algorithm", IEEE, 2001, 521-525, no month.

Prodic, Aleksandar, et al., "Design of a Digital PID Regulator Based on Look-Up Tables for Control of High-Frequency DC-DC Converters", IEEE, 2002, 18-22, no month.

"High-Frequency, SOT23, Step-Down, DC-DC Converter", TPS62200, Texas Instruments Data Sheet, 2002, no month.

"Wide-Input Synchronous Buck Controller", TPS40050, Texas Instruments Data Sheet, 2002, no month.

Prodic, Aleksandar, et al., "Digital Controller Chip Set for Isolated DC Power Supplies", IEEE, 2003, 866-872, no month.

Patella, Benjamin J., et al., "High-Frequency Digital PWM Controller IC for DC-DC Converters", IEEE TPE, Jan. 2003, 18(1):438-446.

Peterchev, Angel V., et al., "Architecture and IC Implementation of a Digital VRM Controller", IEEE TPE, Jan. 2003, 18(1):356-364.

Peterchev, Angel V., et al., "Quantization Resolution and Limit Cycling in Digitally Controlled PWM Converters", IEEE TPE, Jan. 2003, 18(1):301-308.

Syed, Asif, et al., "Digital PWM Controller with Feed-Forward Compensation", IEEE, 2004, 60-66, no month.

* cited by examiner

TABLE II. LOOK-UP TABLE COMPENSATOR DESIGN. THE DUTY-CYCLE CORRECTION IS THE 10-BIT TABLE ENTRY (LAST COLUMN) DIVIDED BY 512.

| Table index | e[n] | e[n-1] | e[n-2] | $512(d_c)$ | 10-bit table entry |
|---|---|---|---|---|---|
| 1 | -1 | -1 | -1 | -0.75 | -1 |
| 2 | -1 | -1 | 0 | 141.25 | 141 |
| 3 | -1 | -1 | 1 | 283.25 | 0 |
| 4 | -1 | 0 | -1 | -291.50 | -292 |
| 5 | -1 | 0 | 0 | -149.50 | -150 |
| 6 | -1 | 0 | 1 | -7.50 | -7 |
| 7 | -1 | 1 | -1 | -582.25 | 0 |
| 8 | -1 | 1 | 0 | -440.25 | 0 |
| 9 | -1 | 1 | 1 | -298.25 | 0 |
| 10 | 0 | -1 | -1 | 148.75 | 149 |
| 11 | 0 | -1 | 0 | 290.75 | 291 |
| 12 | 0 | -1 | 1 | 432.75 | 0 |
| 13 | 0 | 0 | -1 | -142.00 | -142 |
| 14 | 0 | 0 | 0 | 0.00 | 0 |
| 15 | 0 | 0 | 1 | 142.00 | 142 |
| 16 | 0 | 1 | -1 | -432.75 | 0 |
| 17 | 0 | 1 | 0 | -290.75 | -291 |
| 18 | 0 | 1 | 1 | -148.75 | -149 |
| 19 | 1 | -1 | -1 | 298.25 | 0 |
| 20 | 1 | -1 | 0 | 440.25 | 0 |
| 21 | 1 | -1 | 1 | 582.25 | 0 |
| 22 | 1 | 0 | -1 | 7.50 | 7 |
| 23 | 1 | 0 | 0 | 149.50 | 150 |
| 24 | 1 | 0 | 1 | 291.50 | 292 |
| 25 | 1 | 1 | -1 | -283.25 | 0 |
| 26 | 1 | 1 | 0 | -141.25 | -141 |
| 27 | 1 | 1 | 1 | 0.75 | 1 |

Figure 12

DIGITAL PULSE-WIDTH MODULATOR

CROSS-REFERENCE TO RELATED APPLICATIONS

This application claims the benefit of U.S. provisional application No. 60/655,188 entitled "Digital pulse width modulator with feed forward compensation" and filed by Dragan Maksimovic et al. on 22 Feb. 2005, which is hereby incorporated by reference as though fully set forth herein.

BACKGROUND OF THE INVENTION a. Field of the Invention

The instant invention relates to digital pulse-width modulators and switched mode DC-DC power converters utilizing such pulse-width modulators with feed-forward compensation.

b. Background

Pulse-width-modulation (PWM) is a technique for controlling analog circuits with a digital output. PWM is employed in a wide variety of applications, ranging from measurement and communications to power control and conversion. PWM is a way of digitally encoding analog signal levels in which a duty cycle of a square wave is modulated to encode a specific analog signal.

In switched-mode power converters, for example, PWM can be used to control a switching cycle of at least one switch of the power converter. A pulse-width-modulator, for example, may be used in an open-loop or closed-loop control scheme to regulate the output of the power converter. With such a control scheme, feed-forward compensation can be used to reduce effects of input voltage disturbances on the converter output voltage and improve steady-state and dynamic responses of the converter.

Digital controllers for DC-DC power converters can provide custom architectures and realizations of building blocks including high-resolution, high-frequency, digital pulse-width modulators (DPWM), simplified discrete-time compensator schemes, and analog-to-digital (A/D) converters. Digital controllers can also offer advantages of lower sensitivity to parameter variations, programmability, and reduction or elimination of passive components, often without compromising dynamic performance, simplicity, or cost.

While input voltage feed-forward compensation has been used in analog voltage-mode pulse-width modulated controllers, such analog realizations lead to wide process and temperature variations due to parameter values of on-chip passive elements (e.g., resistors and capacitors) and present an important design constraint in terms of chip area and dynamic performance. Analog realizations also require additional analog-to-digital and digital-to-analog converters when used in combination with digital controllers.

BRIEF SUMMARY OF THE INVENTION

A digital pulse-width modulator is provided that receives a digital command input signal and a secondary control input signal and provides a pulse-width-modulated output signal. The pulse-width-modulated output signal comprises a pulse-width that corresponds to an integer number of slots each having a time duration. The integer number of slots corresponds to a value of the digital command signal, and the time duration is determined based upon the secondary control input signal.

In one embodiment, the digital pulse-width-modulator comprises a plurality of delay cells arranged in series for propagating a clock signal through the plurality of delay cells. A time delay for each of the delay cells is determined by the secondary control input signal. A controller is enabled to set the output signal to a first value at the start of a propagation of the clock through the plurality of delay cells and to set the output signal to a second value when the clock signal propagates to one of the delay cells identified by the digital command signal. The controller, for example, may comprise any hardware and/or software implementation of a controller, such as a processor operating instructions and/or digital logic. In one implementation, for example the controller may control digital logic, such as a flip-flop and a multiplexer arranged as described below.

In another embodiment, the digital pulse-width-modulator is used with a switched-mode power converter. A digital command signal based on a feedback signal from the converter and a secondary control signal derived from an input voltage of the converter are received by the digital pulse-width-modulator. The digital pulse-width-modulator provides a pulse-width-modulated output signal based on the digital command signal and the secondary control signal. The output signal is then provided to the converter to control at least one switch of the converter.

In one embodiment, an input-voltage feed-forward compensator is provided with a high-frequency DPWM without additional A/D converters or other increase in chip complexity. A simple table-based programmable compensator and a very small two-comparator A/D converter can be used along with the compensator in a controller for a switched-mode DC-DC power converter. Such a compensator and controller are well suited for a range of DC-DC applications. Low power consumption, small controller area, and a programmable compensator requiring no external passive components can be targeted for low power battery-operated applications, such as where a single cell lithium ion battery power source varies in a range from about 2.5 volts to about 5.5 volts. In such applications, it is desirable to have as many controller components as possible, such as power switches and compensation circuitry, integrated on the same chip.

The foregoing and other aspects, features, details, utilities, and advantages of the present invention will be apparent from reading the following description and claims, and from reviewing the accompanying drawings.

BRIEF DESCRIPTION OF THE DRAWINGS

FIG. 12 shows an exemplary look-up table.

DETAILED DESCRIPTION OF THE INVENTION

Digital Pulse-Width-Modulator

Figure 1:
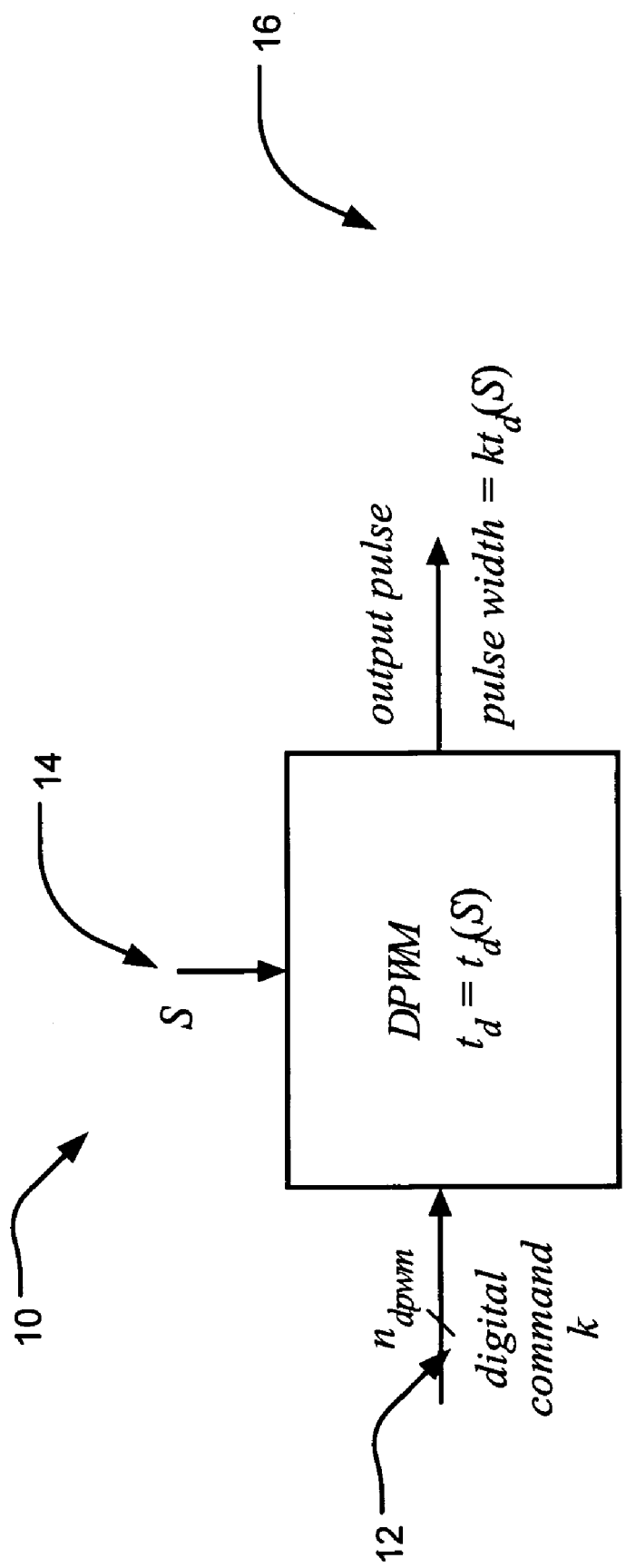
FIG. 1 shows a block diagram of an exemplary feed-forward digital pulse-width modulator.

FIG. 1 shows a block diagram of a feed-forward digital pulse-width-modulator (DPWM) 10. The feed-forward DPWM 10 comprises two input terminals: a digital command input terminal 12 and an analog secondary control input terminal 14. The digital command input terminal 12 receives a digital command signal k, such as a duty-cycle command signal via a digital bus having $n_{pwm}$ bits, and the secondary control input terminal 14 receives a secondary control input signal S. The secondary control input signal S, for example, may comprise a feed-forward control signal, such as an input voltage from an input of a switched-mode power converter, a control signal derived from such an input voltage, another feed-forward control signal, or the like. The feed-forward DPWM 10 further comprises an output terminal 16 for providing a pulse-width-modulated output signal.

Figure 2:
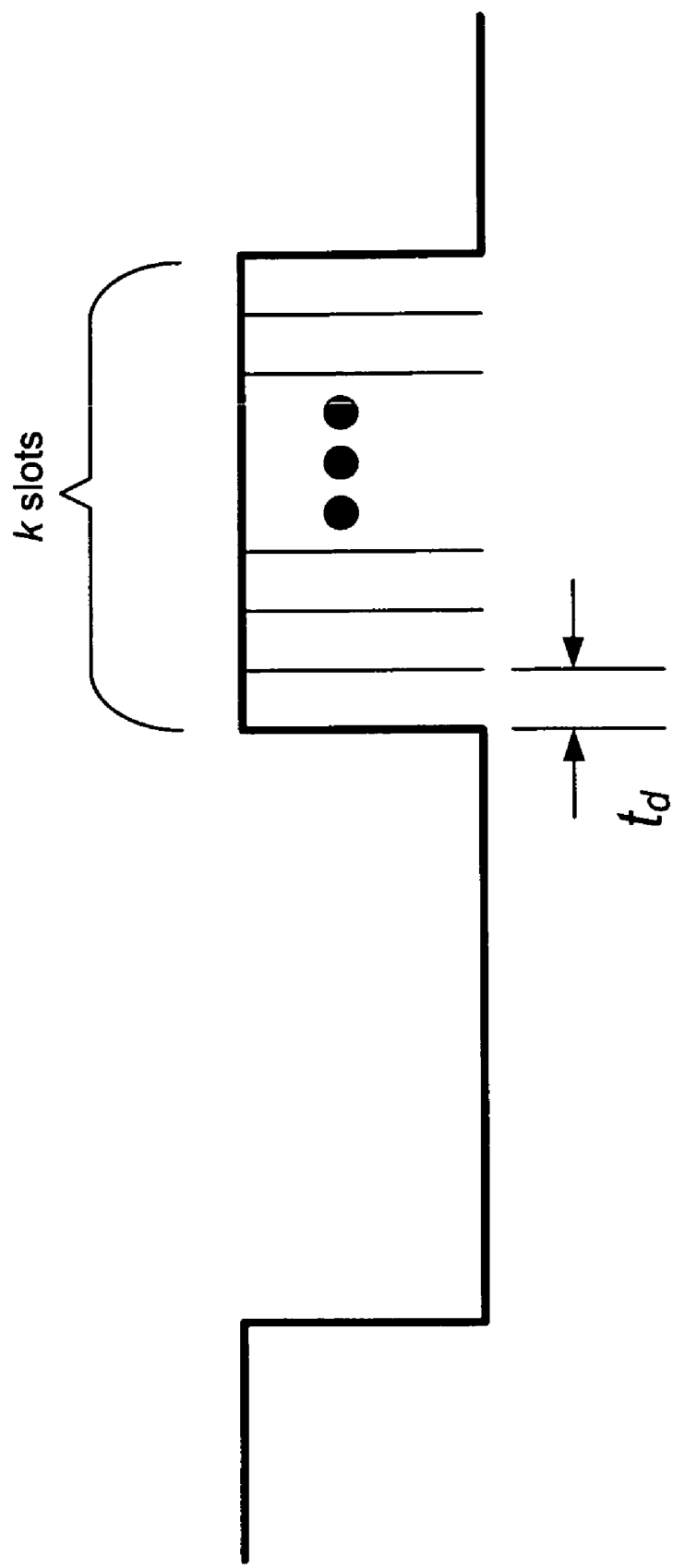
FIG. 2 shows an exemplary digital pulse-width-modulated output signal.

As shown in FIGS. 1 and 2, the feed-forward DPWM 10 provides a pulse-width modulated output signal 18 in which the pulse-width-modulated output signal comprises a number of "cells" or "slots" corresponding to the digital command signal k received at the digital command input terminal 12. The DPWM can also vary the time delay $t_d$ of each of these "cells" or "slots" based upon the secondary control signal S received at the secondary control input terminal 14. Thus, the pulse-width-modulated output signal is based upon both the digital command signal k and the secondary control input signal S such that the pulse-width of the output signal is equal to k $t_d(S)$, where $t_d(S)$ is a time delay that is a function of the secondary control input signal S. In this manner, the pulse-width of the pulse-width-modulated output signal is controlled in a first manner (e.g., by number of slots) based upon the digital command signal k and in a second manner (e.g., by duration of each slot) based upon the secondary control input signal S.

Figure 3A:
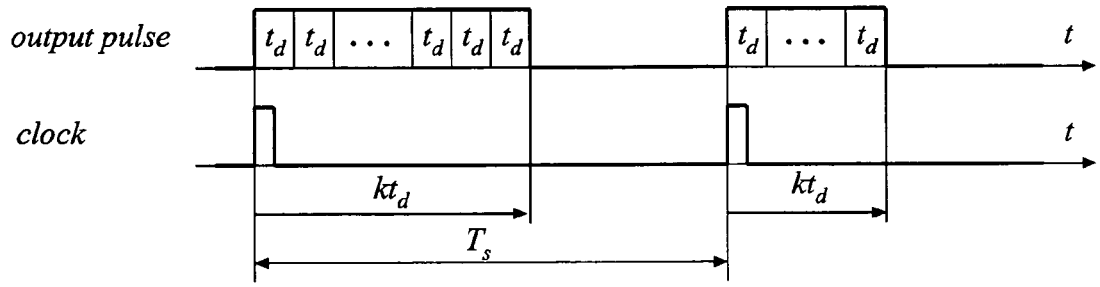
FIGS. 3(a) through 3(c) show exemplary pulse-width-modulated output signals that may be achieved by using trailing-edge modulation, leading-edge modulation, or dual-edge (or triangle-wave) modulations schemes.
Figure 3B:
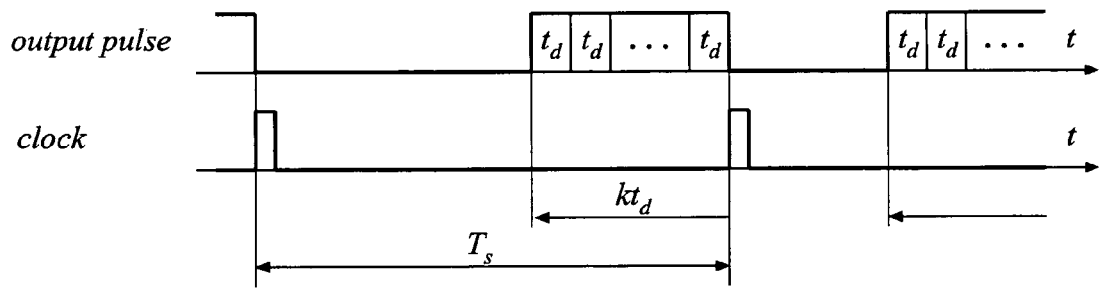
Figure 3C:
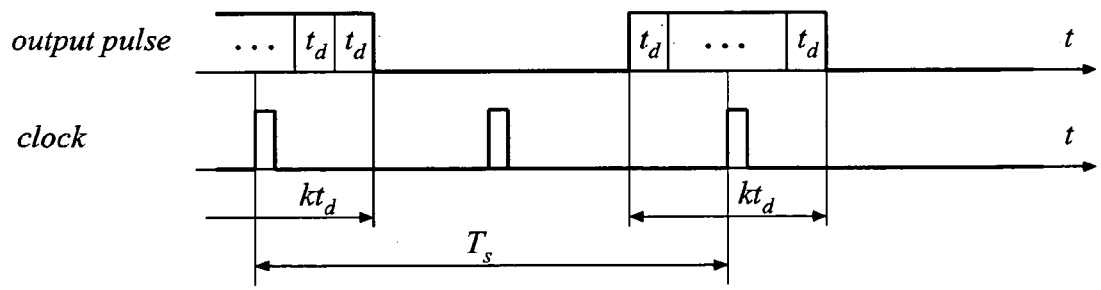

FIGS. 3(a) through 3(c) show three exemplary pulse-width-modulated output signals that may be achieved by using trailing-edge modulation, leading-edge modulation, or dual-edge (or triangle-wave) modulations schemes. These schemes are known in the art and are described, for example, in Arbetter and Maksimovic, "Feedforward Pulse Width Modulators for Switching Power Converters," IEEE Transactions on Power Electronics, Vol. 12, No. 2, March, 1997.

Exemplary Feed-Forward DPWM

Figure 4:
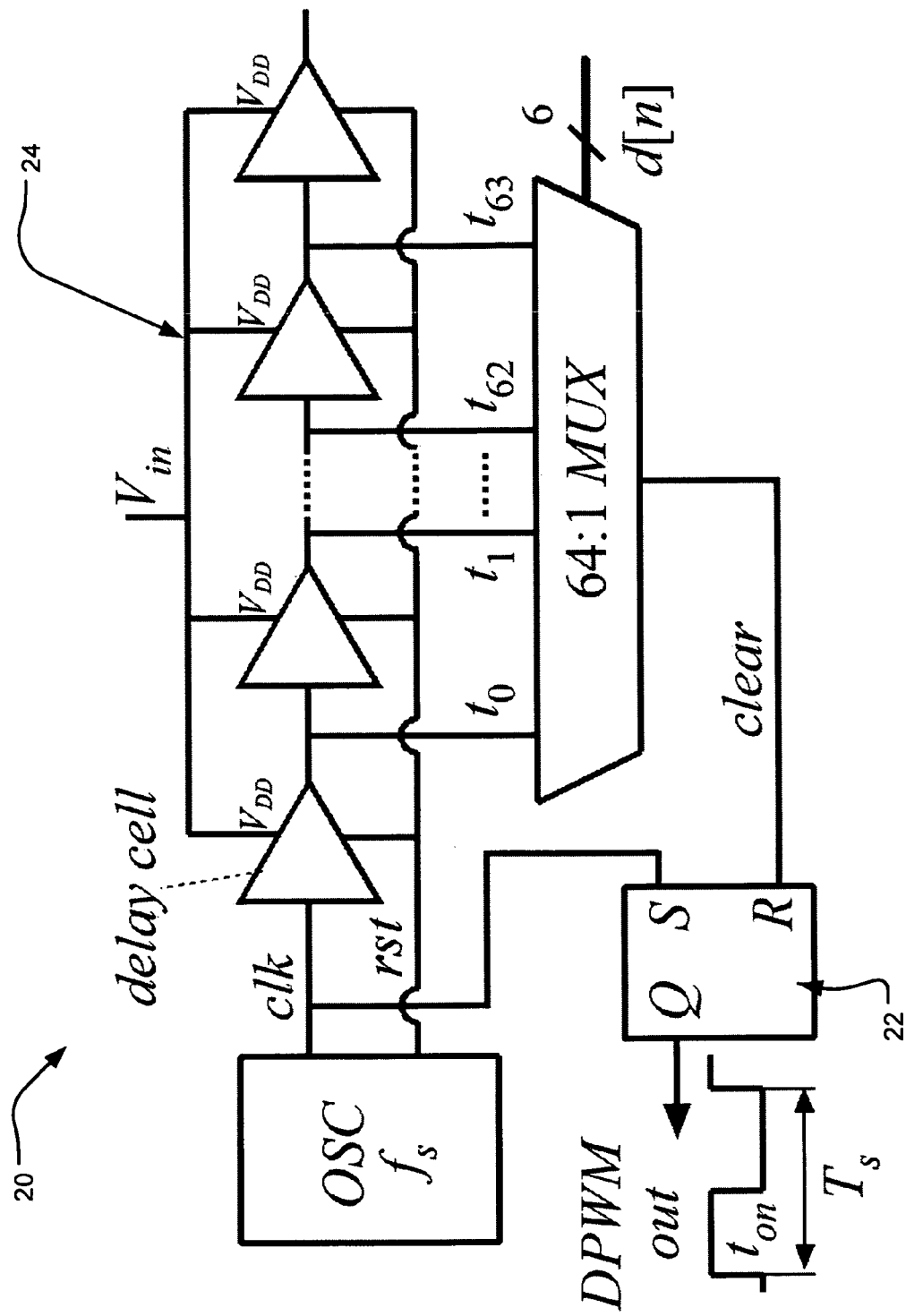
FIG. 4 shows an exemplary feed-forward digital pulse-width-modulator.

FIG. 4 shows one exemplary embodiment of a DPWM 20 that may be used as described above with respect to FIGS. 1 and 2. The DPWM 20 comprises a delay-line configuration in which, at the start of a switching cycle, a clock signal clk sets the output of an SR flip-flop 22 to a first value and starts the clock signal clk propagation through a chain of delay cells 24. When the signal reaches the delay cell selected by a digital duty-cycle command d[n] via a multiplexer, the flip-flop 22 is reset (or set to a second value). The output pulse-width $t_{on}$ is equal to $t_{on}=k \cdot t_d$, where k is a numerical value of a duty cycle command d[n], and $t_d$ is the cell delay. To achieve the feed-forward compensation in a switched-mode power converter using an input voltage of the converter as a feed-forward control signal (or another signal derived from that input voltage), for example, the product of the converter input voltage $V_{in}$ (or a voltage proportional to the input voltage $V_{in}$) and the pulse-width $t_{on}$ is preferably independent of the input voltage. From the formula above, it follows that the feed-forward compensation in the DPWM can be achieved if the cell delay $t_d$ is at least substantially inversely proportional to the input voltage $V_{in}$ (e.g., $t_d=A/V_{in}$, where A may be a constant). In a step-down (buck) power converter, an output quantization step $V_{qDPWM}$ of the DPWM (i.e., the least significant bit (LSB) value in volts is given by $V_{in} \cdot t_d/T_s$, where $T_s=1/f_s$ is the switching period). From the formula above for $t_d$, it follows that a feed-forward DPWM has a constant quantization step, $V_{qDPWM}=V_{in} \cdot t_d/T_s=A/T_s$, independent of the input voltage $V_{in}$. With a constant quantization step and a loop gain independent of the input voltage, limit cycle conditions are also independent of the input voltage $V_{in}$, which is another advantage of a feed-forward DPWM.

In contrast to DPWM designs in which the DPWM operates as a ring-oscillator, the DPWM delay line in the configuration of FIG. 4 is driven by an external clock in an "open-loop" manner. This configuration allows for simple synchronization to an external clock; the switching frequency $f_s$ is equal to the external clock frequency. In some embodiments, however, it should be noted that the cell delay and the length of the delay line are selected so that a desired maximum output duty cycle is achievable under worst-case conditions. In one practical integrated circuit implementation based on the DPWM shown in FIG. 4, it can be assumed that the clock frequency is constant, independent of the input voltage or other operating conditions.

A number of possible implementations may be used to meet the objective of $t_d=A/V_{in}$. In one exemplary implementation, for example, the delay cells may be implemented as standard-cell logic gates. Standard-cell logic gates, for example, can be designed and realized using standard digital design flow based on hardware description language (HDL). The delay of a standard logic cell as a function of the supply voltage $V_{DD}$ (which can be assumed to be equal to the input voltage $V_{in}$) can be expressed as follows:

$$t_d = k_d/(V_{in}-V_t)^\alpha$$

where $\alpha$ is typically between 1 and 2, $V_t$ is a threshold voltage of CMOS devices, and $k_d$ is a constant associated with a particular structure of a standard cell. Assuming that $V_{DD}=V_{in}$ for a typical process with $V_t=0.8$ volts and $\alpha=1.5$, the parameter A in the formula $t_d=A/V_{in}$ varies by a factor of 1.94 over a range of input voltages from 2.5 volts to 5.0 volts.

Figure 5:
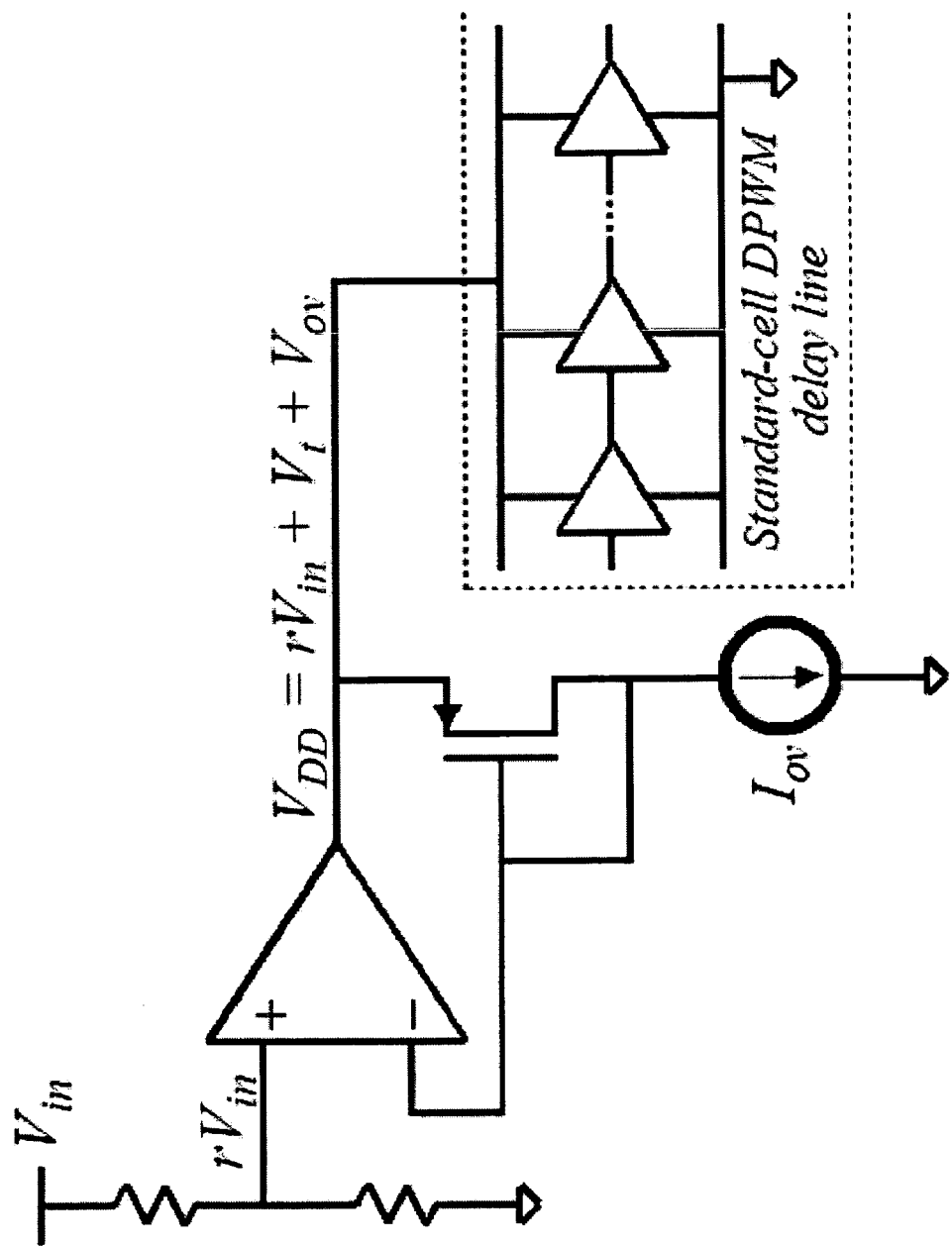
FIG. 5 shows an exemplary embodiment of a delay cell for a feed-forward digital pulse-width-modulator.

In another exemplary implementation, standard-cell logic gates with a scaled supply voltage can be used to reduce dependence on a $V_t$ offset as shown in FIG. 5. In this design, the supply voltage $V_{DD}=r \ V_{in}+V_t+V_{ov}$, which gives the following relationship: $t_d=k_d/(r \ V_{in}+V_{ov})^\alpha$, where r is a constant less than one and $V_{ov}$ is a small overhead voltage of a diode-connected PMOS device, which can be controlled by an $I_{ov}$ bias current. In this implementation, the configuration allows the parameter A to be almost constant over the entire $V_{in}$ range by adjusting $V_{ov}$ and r. In addition, the power consumption of the DPWM supplied from the reduced $V_{DD}$ voltage is also reduced. The implementation, however, requires an analog op-amp to generate the regulated $V_{DD}$ and can suffer from issues related to noise decoupling at the $V_{DD}$ line in the presence of current spikes generated by the DPWM logic gates.

Figure 6:
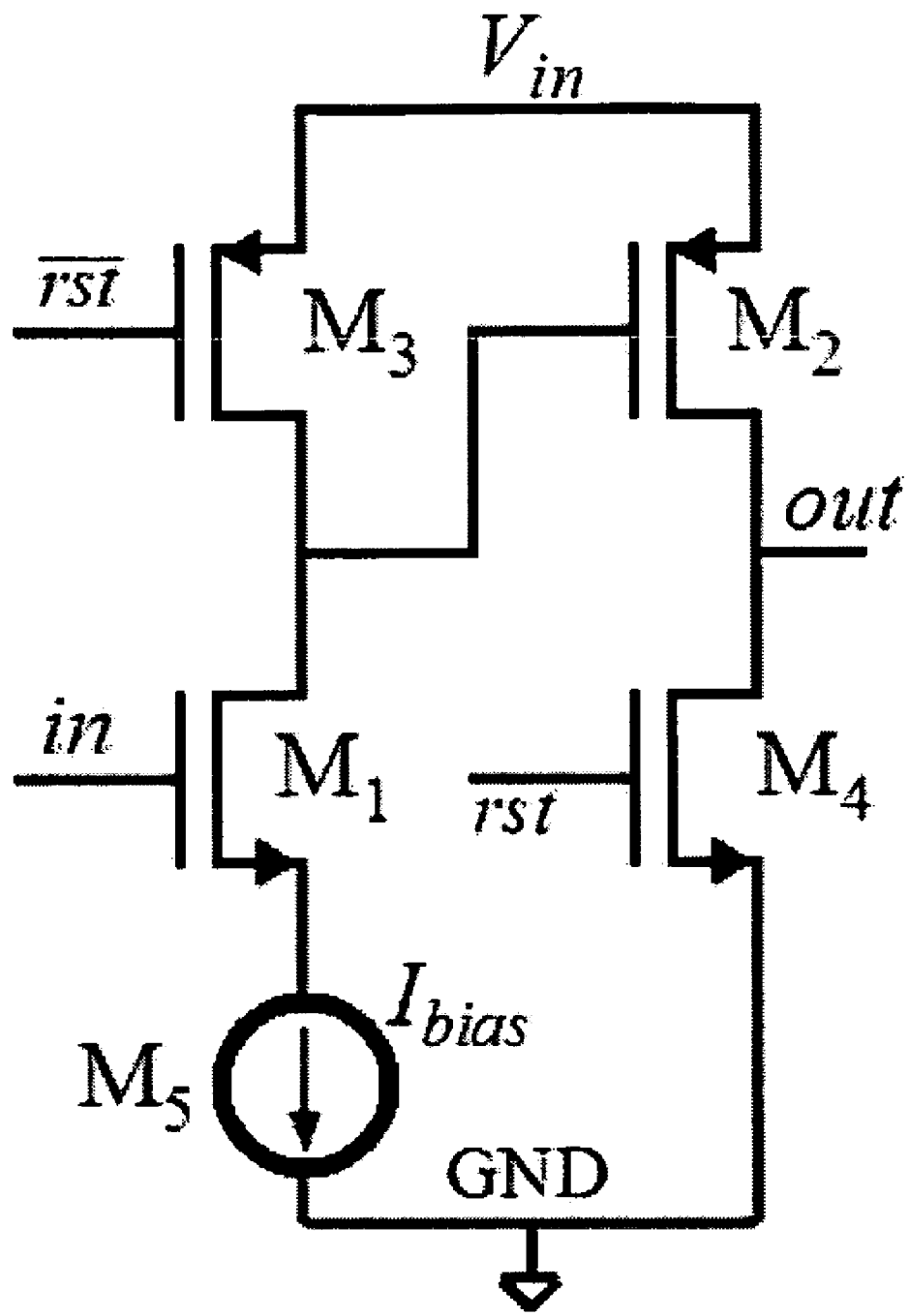
FIG. 6 shows another exemplary embodiment of a delay cell for a feed-forward digital pulse-width-modulator.

In yet another exemplary implementation, however, custom delay cells with a current-starved branch in the delay cell as shown in FIG. 6 may be used. In this implementation, the parameter A can be maintained as a constant by sizing the devices $M_1$ and $M_2$, and the constant current sink device $M_5$. The current sink $M_5$ can be matched from one delay cell to another in order to provide better linearity of the DPWM. Table 1 shows simulation results for an effective DPWM quantization step obtained with the current-starved delay cell for varying process, temperature and input voltages.

TABLE 1

Cell delay $t_d$ and the effective quantization step (for a 6-bit DPWM with 2 bits of dither) for process/temperature and input voltage corners.

| Temperature/Process | Quantity | $V_{in}$ = 2.5 V | $V_{in}$ = 3.3 V | $V_{in}$ = 5.5 V |
|---|---|---|---|---|
| T = −25° C. Slow Process | Delay of a unit cell [nsec] | 24.9 | 17.1 | 10.2 |
| | FF-DPWM quantization step [mV] | 15.6 | 14.1 | 12.8 |
| T = +25° C. Typical Process | Delay of a unit cell [nsec] | 19.5 | 14.5 | 9.6 |
| | FF-DPWM quantization step [mV] | 12.2 | 12.0 | 11.9 |
| T = +80° C. Fast Process | Delay of a unit cell [nsec] | 15.5 | 12.3 | 8.9 |
| | FF-DPWM quantization step [mV] | 9.7 | 10.1 | 11.1 |

Figure 7A:
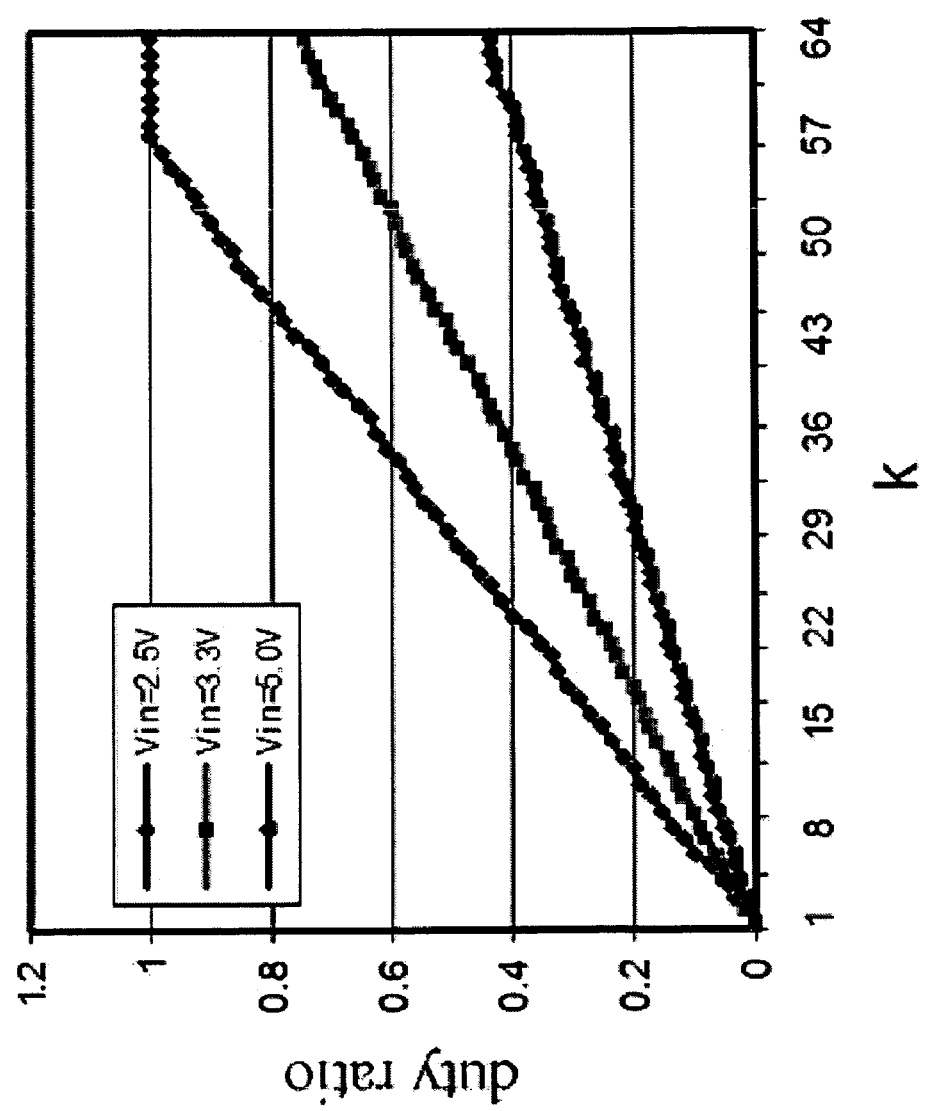
FIGS. 7(a) and 7(b) show experimental results of a feed-forward digital pulse-width-modulator.
Figure 7B:
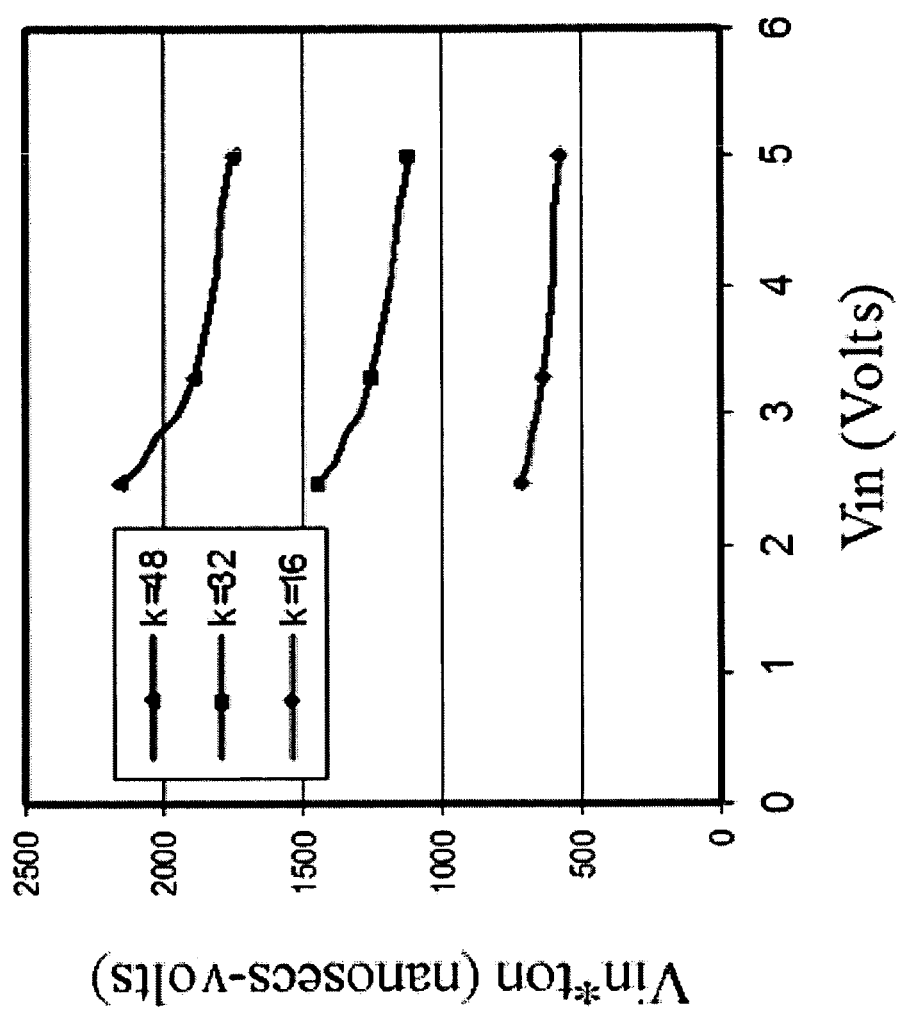

FIGS. 7(a) and 7(b) show experimental results obtained for a prototype test chip with a feed-forward DPWM circuit. FIG. 7(a) shows a measured duty ratio of an output pulse as a function of a digital command for three different input voltages. FIG. 7(b) shows how the product $V_{in} \cdot t_{on}$ stays approximately constant over the wide range of input voltages, which is an indication of good feed-forward compensation with the experimental feed-forward DPWM chip.

Switched-Mode DC-DC Voltage Regulator

Figure 8:
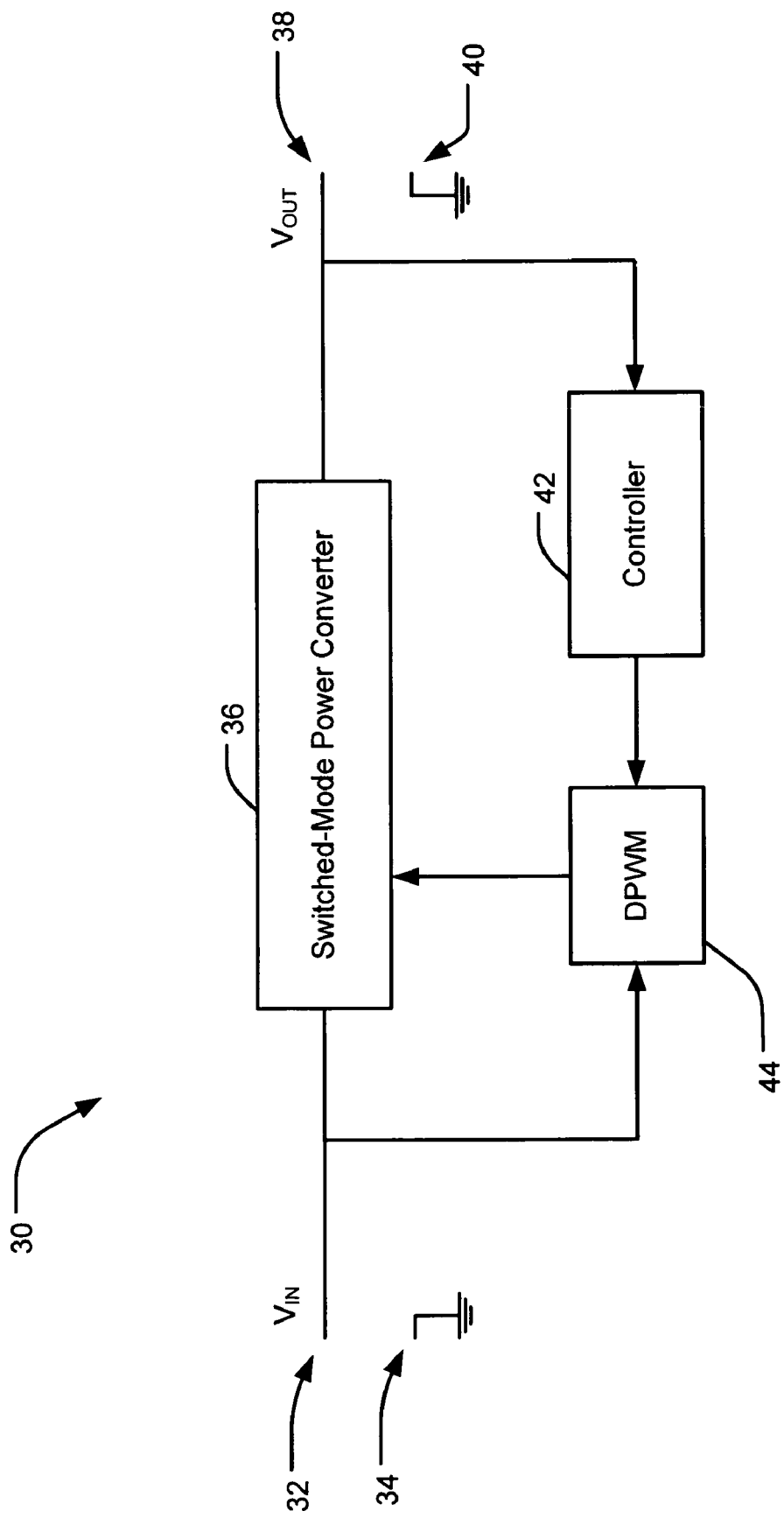
FIG. 8 shows a block diagram of an exemplary switched-mode DC-DC voltage regulator.

FIG. 8 shows a block diagram of an exemplary switched-mode DC-DC voltage regulator 30. The voltage regulator 30 comprises a pair of input terminals 32 and 34 for receiving an input voltage $V_{in}$, a switched-mode power converter 36 including at least one power switch, a pair of output terminals 38 and 40 for providing a regulated output voltage $V_{out}$ for a load, a controller 42, and a digital pulse-width modulator (DPWM) 44.

The switched-mode power converter 36 may comprise any type of switched-mode DC-DC power converter, such as a buck switched-mode power converter, a boost switched-mode power converter, a buck-boost switched-mode power converter, an inverting switched-mode power converter, a DC-DC power converter having a synchronous rectifier or complementary switching devices, such as a synchronous buck, boost, or inverting DC-DC power converter, or half-bridge or full-bridge switching converters, multi-level switching converters, or any other switched-mode DC-DC power converter.

The controller 42 receives a feedback signal (e.g., the output voltage $V_{out}$ and/or an output current $I_{out}$) and provides a feedback loop for use in regulating the output voltage of the switched-mode DC-DC power converter 36. While particular implementations of controllers and DC-DC power converters are described in particular detail, one skilled in the art would readily recognize that other types of converters and controllers may be used within the scope of the present invention. For example, a controller may be implemented in (1) any number of hardware implementations using analog components or custom digital logic, such as in digital logic implemented on one or more programmable logic chips (e.g. a field programmable gate array (FPGA) or complex programmable logic devices (CPLD)), application specific integrated circuits, or custom digital or mixed-signal controller chips; (2) any number of software implementations, such as using microcontrollers, microprocessors, or digital signal processors (DSP) that execute a control method written as software code in an implementation; or (3) any combination of hardware and software implementations. Likewise, a sub-controller may include separate hardware and/or software implementation and/or may comprise a sub-portion of the controller itself. A sub-controller, for example, may comprise separate or overlapping use of digital logic with the controller and/or may include separate or overlapping software code executed on the same or separate microcontroller, microprocessor, or DSP as the controller.

The controller 42 senses an output (e.g., voltage or current) of the switched-mode power converter 36 and compares that output to a reference value to determine if the output is less than, greater than, and/or equal to the reference value. Based upon that determination, the controller 42 provides a control signal (e.g., an error signal or duty cycle command) to direct how long the DPWM is to control at least one power switch of the converter 36 to conduct out of a given switching cycle (e.g., for a longer, shorter, or the same duration). In one implementation, for example, the controller 42 may receive an output voltage $V_{out}$, compare that output voltage to a reference voltage to determine an error signal, determine a duty cycle command based upon the error signal, and provide the duty cycle command to the DPWM 44. As described above, the controller may comprise an analog controller, a digital controller, or a mixed-signal controller.

The DPWM 44 receives the control signal from the controller 42 and digitally controls the operation of at least one switch of the switched-mode power converter 36 based upon the combination of that control signal and a feed-forward input signal received from the input voltage via a feed-forward input of the DPWM. In a switching regulator with voltage-mode control, a pulse-width modulator with feed-forward compensation provides benefits, such as improved line regulation and independence of loop gain with respect to input voltage variations. In addition, certain implementations of digital controllers for high-frequency switching power converters require high-resolution digital pulse-width modulators to enable precise output voltage regulation without limit cycle oscillations caused by A/D and DPWM quantization. Previously proposed approaches to high-frequency, high-resolution DPWM have not addressed feed-forward compensation.

Digital Controller with Feed-Forward Compensation

Figure 9:
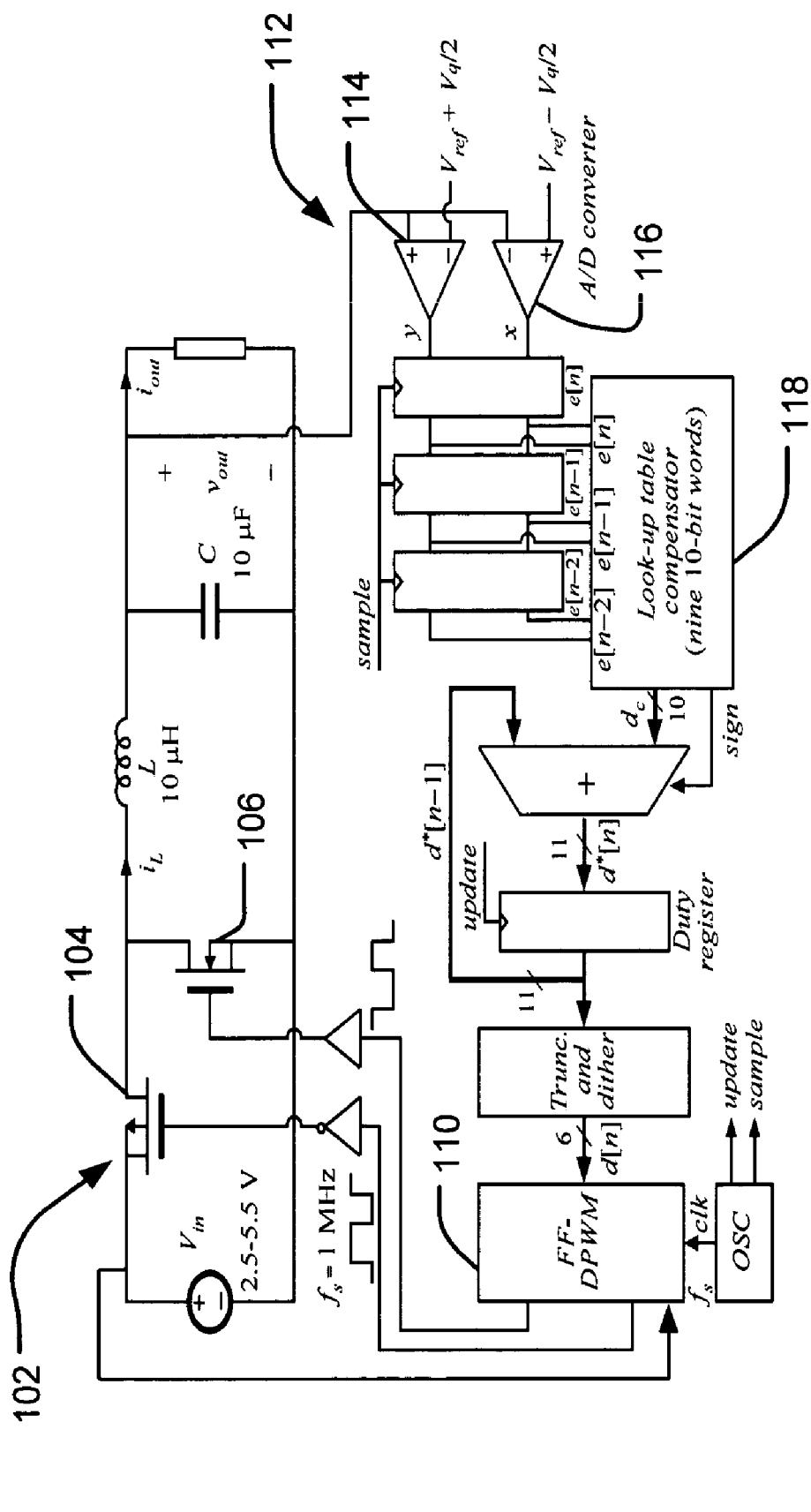
FIG. 9 shows an exemplary embodiment of a DC-DC voltage regulator comprising a feed-forward digital pulse-width-modulator.

Feed-forward DPWM may also be used in the construction of a complete digital pulse-width modulation (DPWM) controller as shown in FIG. 9. As shown in FIG. 9, an exemplary embodiment of a DPWM controller 100 controls the operation of a synchronous rectifier buck power converter 102 comprising a pair of complementary power switches 104 and 106 driven by a feed-forward DPWM 110 of the controller 100. The controller 100 senses an output voltage $V_{out}$ of the converter 102 and converts an analog value of the output voltage to a digital value via a windowed flash A/D converter 112 comprising a pair of comparators 114 and 116. The output voltage is compared to the reference voltages $V_{ref} \pm V_q/2$ and the comparator outputs $\{x, y\}$ are sampled to produce a digital error signal e. In this embodiment, the digital error signal can take three values +1, 0, or −1/Taking advantage of the minimum A/D range, the digital error signals from the current and the two previous cycles are used with a single look-up table compensator 118 to determine a correction $d_c$ for the duty cycle. As a result, a single addition may be used to compute the new duty cycle command d*, which is then truncated to 6 bits and dithered, such as described in Z. Lu et al., "Reduction of digital PWM limit ring with novel control algorithm," IEEE APEC 2001, pp. 521-25, to achieve 8 bits of effective resolution with the 6-bit feed-forward DPWM.

Figure 10:
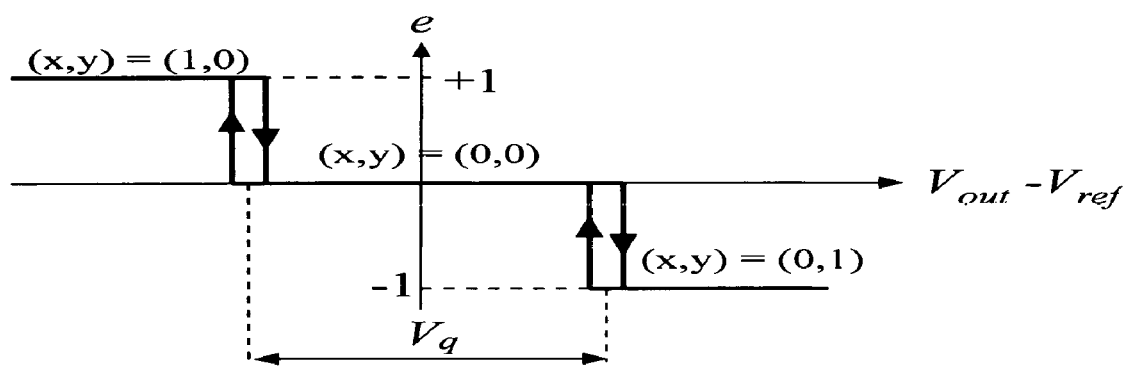
FIG. 10 shows an exemplary conversion characteristic for a windowed A/D converter.

As described above, the A/D converter 112 comprises a flash converter having two comparators 114 and 116. A conversion characteristic for this converter is shown in FIG. 10. An output digital error signal e is 0 if the sensed output voltage is within the bin of $V_q/2$ around the reference voltage $V_{ref}$. An error of +1 or −1 indicates that the converter is out of regulation. In a closed-loop operation, the steady-state error is 0, which means that the dc output voltage is regulated in the $V_{ref} \pm V_q/2$ band. The converter and the compensator can be designed so that during transients the output voltage does not depart from regulation by more than about $V_q$, which allows for the capability of three quantization levels to represent the digital error signal. On a prototype chip that was experimentally tested, the comparators had about a 300 ns delay, a current consumption of about 15 µA, common-mode input voltage range from 0.8 V to $V_{in}$ and a hysteresis of about 5 mV around the transition points to improve noise immunity.

The look-up table compensator 118 of the DPWM controller 100 can be designed in a number of ways, such as using direct digital design techniques, a digital redesign technique starting from a continuous-time compensator design, and/or a pole-zero matching digital redesign technique. A continuous time control to output transfer function for a buck converter, such as shown in FIG. 9, can be given by the following formula:

$$G_{vd}(s) = \frac{V_{in}}{1+(s/Q\omega_0)+(s/\omega_0)^2},$$

where $Q = R \cdot \sqrt{L/C}$ and $\omega_0 = 2\pi f_0 = 1/\sqrt{LC}$.

Figure 11:
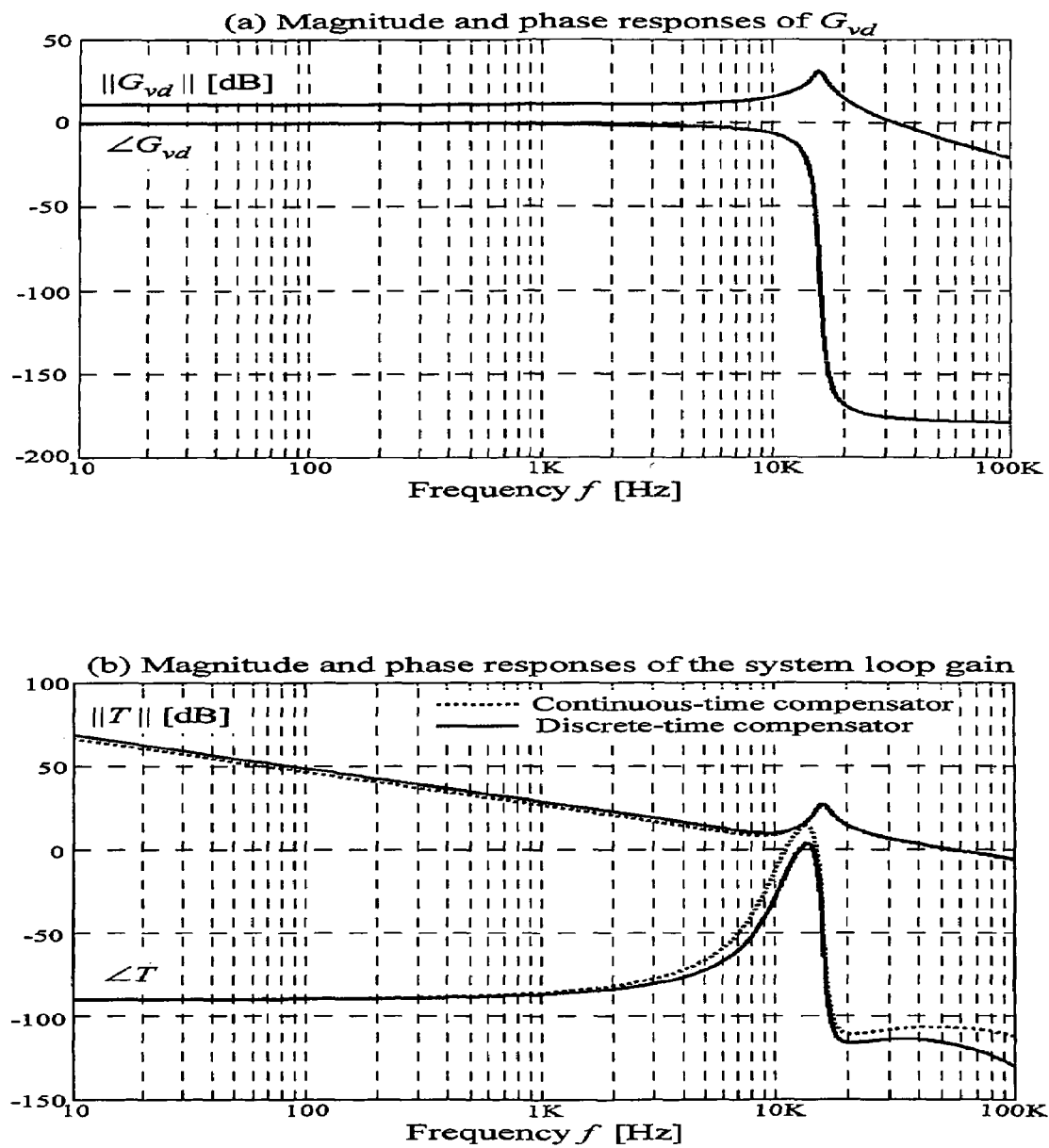
FIGS. 11(a) and 11(b) show an exemplary loop gain response of a system without feed-forward compensation and with feed-forward compensation, respectively.

The compensator design starts from the continuous time equivalent $G_{cmp}(s)$ of a proportional-integral-derivative (PID) compensator:

$$G_{cmp}(s) = \frac{d^*(s)}{v_e(s)} = K_c \frac{1+s/(Q_{cmp}\omega_z)+(s^2/\omega_z^2)}{s},$$

where the parameter $Q_{cmp}$, the zero frequency $f_z = \omega_z/2\pi$, and the gain $K_c$ are adjusted to achieve a desired cross-over frequency (e.g., about 80 KHz) and a phase margin (e.g., about 56°), taking into account a delay of about $T_s/2$ from the time the output voltage is sampled to the time the duty cycle of the gate-drive pulse is updated. FIGS. 11(a) and 11(b) show an exemplary loop gain response of a system without compensation ($G_{cmp}=1$) and with a PID compensator. In this example, $K_c = 3 \cdot 10^6$, $Q_{cmp} = 1.269$, and $f_z = 10.43$ kHz.

A discrete-time equivalent of the PID compensator may have the following form, for example: d*[n]=d*[n−1]+ae[n]+be[n−1]+ce[n−2], where e[n], e[n−1], and e[n−2] comprise the digital error signals, d*[n−1] is the digital duty-cycle command stored from the previous cycle, and d[n] is the current duty cycle command. The compensator coefficients a, b, and c can be found, for example, from the following pole-zero matching method: $r = \exp(-\pi f_z/Q_{cmp} f_{sw})$, $b = -a \cdot 2r \cdot \cos(2\pi(f_z/f_{sw}))$, and $c = a \cdot r^2$.

In one embodiment, for example, the value of the coefficient a can be determined such that the magnitude response of the discrete-time implementation approximately matches the magnitude response of the continuous-time compensator at a desired crossover frequency $f_c$. As a result for the example described above, the discrete time compensator parameters may be a=0.29199, b=−0.56787, and c=0.27734.

In an embodiment using the flash A/D converter in which the error values e[n], e[n−1], and e[n−2] can take one of three possible values (e.g., +1, 0, or −1), the computation of duty cycle correction d*[n]=d*[n−1]+ae[n]+be[n−1]+ce[n−2] may be performed using a single look-up table addressed by the three digital error signals. In construction of the table, a trade-off may be made between the lengths of the entries and the precision of the stored values. FIG. 12 shows an exemplary look-up table that was implemented on a test chip. The table entries are ten-bit values, with one bit representing the sign (e.g., two's complement format may be used to store positive and negative values). With three error values, each with three possible values, there are a total of 27 possible values for the duty cycle correction dc. The fifth column of the look-up table (512 $d_c$) shows a computed correction value (scaled by $2^9=512$), and actual table entries are shown in the last column of the table. In this embodiment, the values are rounded to the nearest integer to fit into the ten-bit table entries. The table size is further reduced by noting that the entries with indices 27 to 15 are the same as the entries with the indices 1 to 13, except for the sign. Instead of storing entries 15 to 27 in the table, the adder can be extended to perform addition or subtraction of the duty-cycle correction, depending on the sign as shown in FIG. 6.

Finally, an additional step in the table design may include eliminating the entries corresponding to a sequence of error values that should never occur during transients. As seen in the look-up table of FIG. 12, the entries with indices 3, 7, 8, 9, and 12 are assigned the default value of $d_c=0$ instead of the computed values. Thus, a final complete look-up table may comprise only nine ten-bit values shown in bold in the last column of the look-up table.

Using the look-up table to determine the duty-cycle correction $d_c[n]$, the duty cycle command d[n] is then found as $d^*[n]=d^*[n-1]+d_c[n]$, and $d[n]$=Truncate and dither ($d^*[n]$). In the truncate and dither step, an eleven-bit signed value of $d^*[n]$ may first be truncated to a six-bit unsigned value corresponding to the duty cycle command between the 0 and 1. Then, a dither scheme is applied to extend the effective DPWM resolution. In the test chip, the number of dither bits (0, 1, 2, or 3) is selectable by a two-bit external digital input, to allow experimentation with different effective DPWM resolutions.

In the test chip, the compensator, including the truncate and dither functions, was designed using Verilog hardware description language.

EXAMPLE

A DPWM controller may be used in a wide range of DC-DC applications. One exemplary application for the regulator shown in FIG. 9 is a low-power 1 MHz buck DC-DC power converter supplied from a lithium ion battery (2.5 volts<$V_{in}$<5.5 volts) that produces a regulated output voltage $V_{out}$=1.5 volts at a load current of up to 300 mA.

Figure 13:
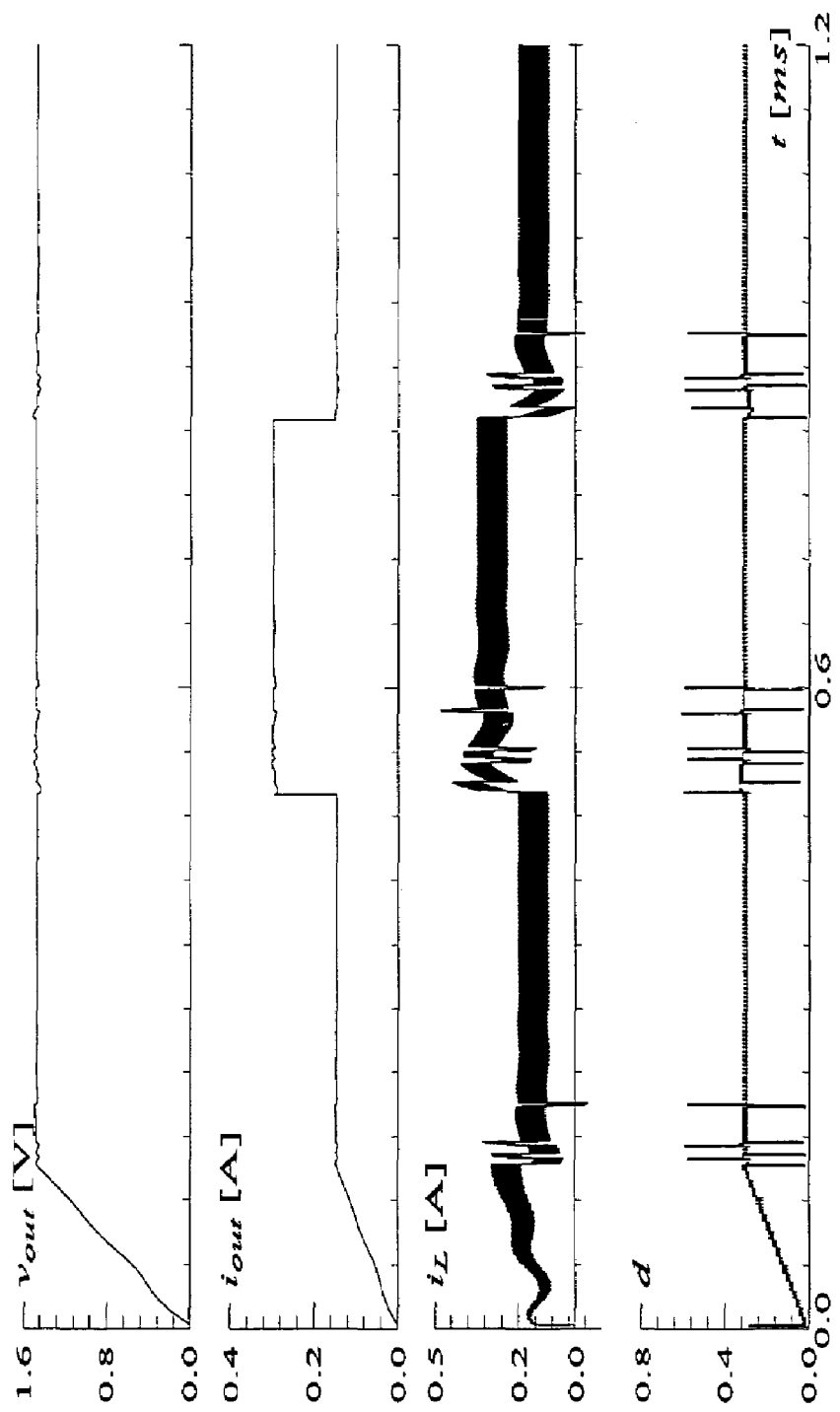
FIG. 13 shows exemplary mixed-signal simulation results.

Mixed signal simulation results are shown in FIG. 13. The system comprises a soft start-up feature in which upon start-up the error voltage is large and the digital error signal is saturated at e=+1. As a result, the compensator exhibits a "slew-rate" limited response where the duty cycle is gradually increased from 0 to a steady-state value. The load transient response is relatively fast. Even during relatively large load transients (e.g., 50 to 100%), the output voltage error stays small enough that a minimum-range two-comparator A/D converter is sufficient to adequately produce a digital error signal.

Figure 14:
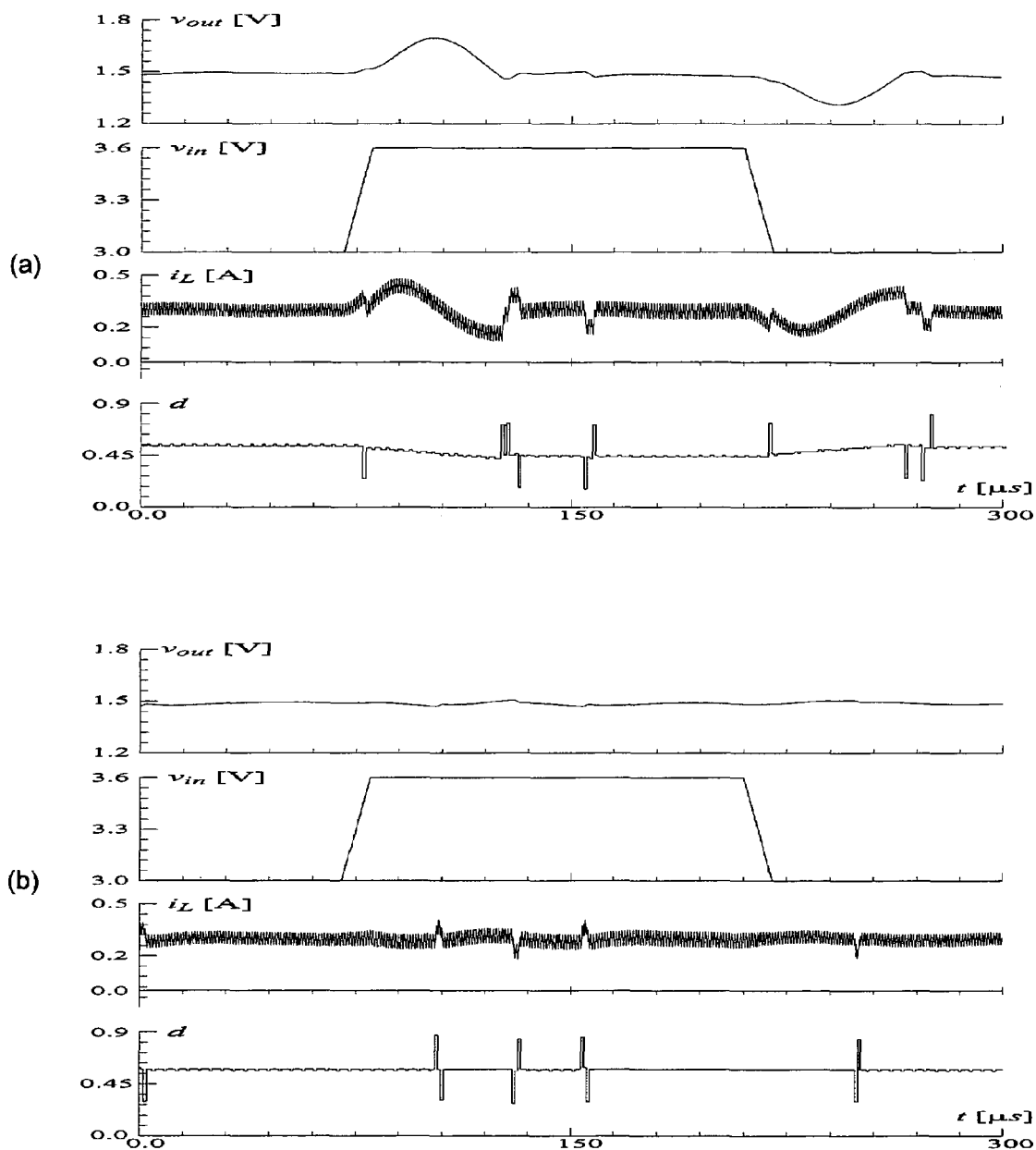
FIGS. 14(a) and 14(b) show mixed-signal simulation results for a line transient response of the exemplary DC-DC power converter without feed-forward DPWM and with feed-forward DPWM, respectively.

FIGS. 14(a) and 14(b) show mixed-signal simulation results for a line transient response of the exemplary DC-DC power converter without and with feed-forward DPWM, respectively. As is evident from the figures, feed-forward compensation substantially rejects transients in the line voltage of the converter.

A digital pulse-width modulator and a digital PWM controller for regulating the output of a DC-DC power converter including the digital pulse-width modulator are provided. In one embodiment, for example, feed-forward compensation of the input voltage is accomplished through a delay-line DPWM where a cell delay is made inversely proportional to the input voltage.

Although several embodiments of this invention have been described above with a certain degree of particularity, those skilled in the art could make numerous alterations to the disclosed embodiments without departing from the spirit or scope of this invention. For example, although the embodiment shown in FIG. 9 comprises a digital implementation of a feed-forward DPWM voltage-mode controller, other implementations such as analog or mixed-signal controllers, current-mode controllers, or even other modulation techniques such as pulse-frequency modulation could be used. In addition, although implementations of digital pulse-width-modulators have been shown and described for use with buck power converters, various other implementations of digital pulse-width-modulators can be designed for use with other types of switched-mode power converters, such as boost, buck-boost, Watkins-Johnson, bridge, and quadratic converters. Arbetter and Maksimovic, "Feedforward Pulse Width Modulators for Switching Power Converters," IEEE Transactions on Power Electronics, Vol. 12, No.2, March, 1997 and Maksimovic and Arbetter, "Feedforward pulse-width modulator for boost DC-DC power converters," Electronic Letters, Vol.31, No.7, Mar. 30, 1995, for example, disclose design concepts that may be used to design digital pulse-with-modulators with feed-forward compensation for these other types of converters. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A method of generating a digital pulse-width-modulated signal, the method comprising:
   receiving a digital command signal;
   receiving a secondary control input signal; and
   generating a pulse-width-modulated output signal based upon the digital command signal and the secondary control input signal, wherein a pulse-width of the pulse-width-modulated output signal comprises an integer number of slots each having a time duration, wherein the number of slots corresponds to a value of the digital command signal and the time duration is determined based upon the secondary control input signal.

2. The method of claim 1 wherein the generating operation comprises propagating a clock signal through a series of delay cells.

3. The method of claim 2 wherein the time duration of each slot is determined by controlling a time delay of each delay cell based upon the secondary control input signal.

4. The method of claim 2 wherein the integer number of slots is determined by selecting a delay cell based upon the digital command signal.

5. The method of claim 2 wherein the integer number of slots is determined by selecting a delay cell based upon the digital command signal and the time duration of each slot is determined by controlling a time delay of each delay cell based upon the secondary control input signal.

6. The method of claim 2 wherein at least one of the series of delay cells comprises a standard-cell logic gate.

7. The method of claim 2 wherein at least one of the series of delay cells comprises a standard-cell logic gate with a scaled supply voltage.

8. The method of claim 2 wherein at least one of the series of delay cells comprises current-starved delay cell.

9. The method of claim 2 wherein a first delay cell and a second delay cell of the series of delay cells each comprises a current-starved delay cell, and a first current sink of the first delay cell is matched to a second current cell of the second delay cell.

10. The method of claim 1 wherein the digital command signal comprises a duty-cycle command.

11. The method of claim 10 wherein the duty-cycle command is based upon a feedback signal received from a switched-mode power converter.

12. The method of claim 10 wherein the duty cycle command is determined at least in part by reference to a look-up table.

13. The method of claim 12, wherein the duty cycle command is determined at least in part by reference to a single look-up table.

14. The method of claim 12 wherein the duty-cycle command is further determined by truncating and dithering a duty-cycle correction value obtained via the look-up table.

15. The method of claim 1 further comprising:
receiving a feedback signal from a switched-mode power converter;
comparing the feedback signal to a reference signal; and
determining an error signal based upon the comparison of the feedback signal to the reference signal,
wherein the digital command signal is based upon the error signal.

16. The method of claim 15 wherein the digital command signal comprises a duty-cycle command based upon the error signal.

17. The method of claim 15 wherein the operation of comparing the feedback signal to a reference signal comprises a windowed A/D converter.

18. The method of claim 15 wherein the operation of determining an error signal comprises assigning an error signal based upon whether the feedback signal is within an error boundary or outside the error boundary.

19. The method of claim 15 wherein the operation of determining an error signal comprises assigning an error signal based upon whether the feedback signal is less than an error boundary, within or equal to the error boundary, or greater than the error boundary.

20. The method of claim 15 wherein the operation of determining an error signal comprises assigning an error signal based upon whether the feedback signal is less than or equal to an error boundary, within the error boundary, or greater than or equal to an the error boundary.

21. The method of claim 1 wherein the secondary control input signal comprises a feed-forward control signal.

22. The method of claim 21 wherein the feed-forward control signal is derived from an input voltage of a switched-mode power converter.

23. The method of claim 21 wherein the feed-forward control signal comprises an input voltage of a switched-mode power converter.

24. A digital pulse-width-modulator comprising:
a first digital input for receiving a digital command signal;
a second input for receiving a secondary control input signal;
a pulse-width-modulated output for providing a pulse-width-modulated output signal based upon the digital command signal and the secondary control input signal; and
a controller enabled to generate a pulse-width-modulated output signal based upon the digital command signal and the secondary control input signal, wherein a pulse-width of the pulse-width-modulated output signal comprises an integer number of slots each having a time duration, wherein the number of slots corresponds to a value of the digital command signal and the time duration is determined based upon the secondary control input signal.

25. A digital pulse-width-modulator comprising:
a first digital input for receiving a digital command signal;
a second input for receiving a secondary control input signal;
a pulse-width-modulated output for providing a pulse-width-modulated output signal based upon the digital command signal and the secondary control input signal;
a plurality of delay cells arranged in series for propagating a clock signal through the plurality of delay cells, wherein a time delay for each of the plurality of delay cells is determined by the secondary control input signal received via the second input; and
a controller enabled to set the output signal to a first value at a start of a propagation of the clock through the plurality of delay cells and set the output signal to a second value when the clock signal propagates to one of the delay cells identified by the digital command signal.

26. The digital pulse-width-modulator of claim 25 wherein the digital command signal is based upon a feedback signal received from a switched-mode converter.

27. The digital pulse-width-modulator of claim 26 wherein the digital command signal is further based upon an error signal determined by comparing the feedback signal to a reference signal.

28. The digital pulse-width-modulator of claim 25 wherein the secondary control input signal comprises a feed-forward input signal.

29. The digital pulse-width-modulator of claim 28 wherein the feed-forward signal is derived from an input voltage of a switched-mode converter.

30. The digital pulse-width-modulator of claim 25 wherein the feed-forward signal comprises an input voltage of a switched-mode converter.

31. The digital pulse-width-modulator of claim 25 wherein at least one of the series of delay cells comprises a standard-cell logic gate.

32. The digital pulse-width-modulator of claim 25 wherein at least one of the series of delay cells comprises a standard-cell logic gate with a scaled supply voltage.

33. The digital pulse-width-modulator of claim 25 wherein at least one of the series of delay cells comprises current-starved delay cell.

34. The digital pulse-width-modulator of claim 25 wherein a first delay cell and a second delay cell of the series of delay cells each comprises a current-starved delay cell, and a first current sink of the first delay cell is matched to a second current cell of the second delay cell.

35. The digital pulse-width-modulator of claim 25 wherein the time delay of each of the plurality of delay cells is substantially inversely proportional to the second input signal.

36. The digital pulse-width-modulator of claim 25 wherein the controller comprises digital logic.

37. The digital pulse-width-modulator of claim 25 wherein the controller comprises a flip-flop operative to set the output signal to a first value and to a second value.

38. The digital pulse-width-modulator of claim 37 wherein the controller further comprises a multiplexer for forwarding a signal to the flip-flop to indicate a transition in the output signal.

39. The digital pulse-width-modulator of claim 25 wherein the controller is enabled to set the output signal at the start of the propagation of the clock through the plurality of delay cells and reset the output signal to the second value when the clock signal propagates to the delay cell identified by the digital command signal.

40. The digital pulse-width-modulator of claim 39 wherein the controller is further enabled to reset the output signal at the start of a second propagation of the clock through the plurality of delay cells and set the output signal to the second value when the clock signal propagates to the delay cell identified by the digital command signal.

41. The digital pulse-width-modulator of claim 25 wherein the controller is enabled to reset the output signal at the start of the propagation of the clock through the plurality of delay cells and set the output signal to the second value when the clock signal propagates to the delay cell identified by the digital command signal.

42. The digital pulse-width-modulator of claim 25 further comprising an oscillator for providing the clock signal.

43. The digital pulse-width-modulator of claim 25 further comprising a clock input for receiving the clock signal.

44. A digital pulse-width-modulator comprising:
   a first digital input for receiving a digital command signal;
   a second input for receiving a secondary control input signal;
   a pulse-width-modulated output for providing a pulse-width-modulated output signal based upon the digital command signal and the secondary control input signal;
   a means for propagating a clock signal through the plurality of delay cells, wherein a time delay for each of the plurality of delay cells is determined by the secondary control input signal received via the second input; and
   a means for setting the output signal to a first value at a start of a propagation of the clock through the plurality of delay cells and setting the output signal to a second value when the clock signal propagates to one of the delay cells identified by the digital command signal.

45. The digital pulse-width-modulator of claim 44 wherein the means for setting the output signal comprises a flip-flop and a multiplexer.

46. A switched-mode DC-DC voltage regulator comprising:
   a switched-mode converter comprising an input voltage terminal and an output voltage terminal;
   a controller enabled to receive a feedback signal from the switched-mode converter and to determine a duty cycle command; and
   a digital pulse-width-modulator coupled to the controller to receive the duty cycle command from the controller and to the switched-mode converter to receive a signal derived from an input voltage of the converter and to provide a pulse-width-modulated control signal to control the operation of at least one switch of the switched-mode converter,
   wherein the digital pulse-width-modulator is enabled to generate the pulse-width-modulated control signal based upon a combination of the duty cycle command and the signal derived from the input voltage of the switched-mode converter.

47. The switched-mode DC-DC voltage regulator of claim 46 wherein the signal derived from the input voltage of the switched-mode converter comprises the input voltage of the switched-mode converter.

48. The switched-mode DC-DC voltage regulator of claim 46 wherein the digital pulse-width-modulated control signal is generated by selecting a number of delay cells based upon the duty cycle command and a time delay of the delay cells is based upon the signal derived from the input voltage of the switched-mode converter.

* * * * *